US010566984B2

(12) United States Patent
Kikunaga

(10) Patent No.: US 10,566,984 B2
(45) Date of Patent: Feb. 18, 2020

(54) SIGNAL PROCESSING CIRCUIT

(71) Applicant: OMRON Corporation, Kyoto (JP)

(72) Inventor: Yoshitaka Kikunaga, Kyoto (JP)

(73) Assignee: OMRON Corporation, Kyoto (JP)

( * ) Notice: Subject to any disclaimer, the term of this patent is extended or adjusted under 35 U.S.C. 154(b) by 0 days.

(21) Appl. No.: 16/351,520

(22) Filed: Mar. 13, 2019

(65) Prior Publication Data

US 2019/0348991 A1 Nov. 14, 2019

(30) Foreign Application Priority Data

May 11, 2018 (JP) ................................. 2018-092482

(51) Int. Cl.
*H03M 1/34* (2006.01)
*H03M 1/06* (2006.01)
*H03F 3/45* (2006.01)

(52) U.S. Cl.
CPC ............ *H03M 1/0607* (2013.01); *H03F 3/45* (2013.01)

(58) Field of Classification Search
CPC ........ H03M 1/0607; H03M 1/12; H03M 1/00; H03M 3/00; H03F 3/45
USPC .................................................. 341/155, 162
See application file for complete search history.

(56) References Cited

U.S. PATENT DOCUMENTS

| | | | | |
|---|---|---|---|---|
| 6,222,406 B1* | 4/2001 | Noda | .................... | G11C 7/1078 327/269 |
| 7,061,419 B2* | 6/2006 | Sushihara | ........... | H03M 1/0604 341/155 |
| 7,623,054 B2* | 11/2009 | Iriguchi | ............... | G09G 3/3688 330/253 |
| 2003/0189540 A1* | 10/2003 | Itakura | ................. | G09G 3/3688 345/89 |
| 2005/0040889 A1* | 2/2005 | Tsuchi | .................. | H03F 3/3022 330/255 |
| 2009/0231015 A1* | 9/2009 | Tobita | .............. | H03K 3/356113 327/333 |
| 2016/0048707 A1* | 2/2016 | Alladi | .................... | G06G 7/186 341/143 |

FOREIGN PATENT DOCUMENTS

| | | |
|---|---|---|
| EP | 2197109 | 6/2010 |
| EP | 2317652 | 5/2011 |
| JP | 2006020171 | 1/2006 |

OTHER PUBLICATIONS

"Search Report of Europe Counterpart Application", dated Oct. 17, 2019, pp. 1-11.

(Continued)

*Primary Examiner* — Jean B Jeanglaude
(74) *Attorney, Agent, or Firm* — JCIPRNET

(57) ABSTRACT

A signal processing circuit with high noise resistance is realized. The signal processing circuit includes: a first pre-stage circuit that includes a first input terminal; and a second pre-stage circuit that includes a second input terminal. A resistive element with one end connected to the first input terminal and a capacitative element with one electrode connected to the ground are provided in the first pre-stage circuit. The other end of the first resistive element and the other electrode of the first capacitative element are connected to each other. An output node of the first pre-stage circuit and an output node of the second pre-stage circuit are connected to a post-stage circuit.

19 Claims, 4 Drawing Sheets

(56) References Cited

OTHER PUBLICATIONS

Young Jin Kim et al, "A high dynamic range data acquisition system for a solid-state electron Electric Dipole Moment experiment", ARXIV. ORG, Cornell University Library, Jun. 7, 2011, pp. 1-9.
Sally Paterson, "Maximize performance when driving differential ADCs", EDN Network, vol. 48, No. 13, Jun. 12, 2003, pp. 69-72.

* cited by examiner

SIGNAL PROCESSING CIRCUIT

CROSS-REFERENCE TO RELATED APPLICATION

This application claims the priority of Japan patent application serial no. 2018-092482, filed on May 11, 2018. The entirety of the above-mentioned patent application is hereby incorporated by reference herein and made a part of this specification.

BACKGROUND

Technical Field

The disclosure relates to a signal processing circuit that performs AD conversion (analog-to-digital conversion).

Description of Related Art

Patent Document 1 discloses a configuration using a differential amplifier for AD conversion of a differential input signal.

PATENT DOCUMENTS

[Patent Document 1] Japanese Laid-open No. 2006-20171 (published on Jan. 19, 2006)

The configuration disclosed in Patent Document 1 has a poor noise removing effect with which it is not possible to address increasing an input range and a resolution.

SUMMARY

According to an embodiment, a signal processing circuit includes: a first pre-stage circuit that includes a first input terminal for receiving one of differential input; a second pre-stage circuit that includes a second input terminal for receiving another one of the differential input; a post-stage circuit that includes a differential output amplifier; and an analog-to-digital conversion circuit that is connected to the post-stage circuit. The first pre-stage circuit includes a first resistive element with one end connected to the first input terminal and a first capacitative element with one grounded electrode. The other end of the first resistive element and the other electrode of the first capacitative element are connected to each other. An output node of the first pre-stage circuit and an output node of the second pre-stage circuit are connected to the post-stage circuit.

DESCRIPTION OF THE EMBODIMENTS

Figure 1:
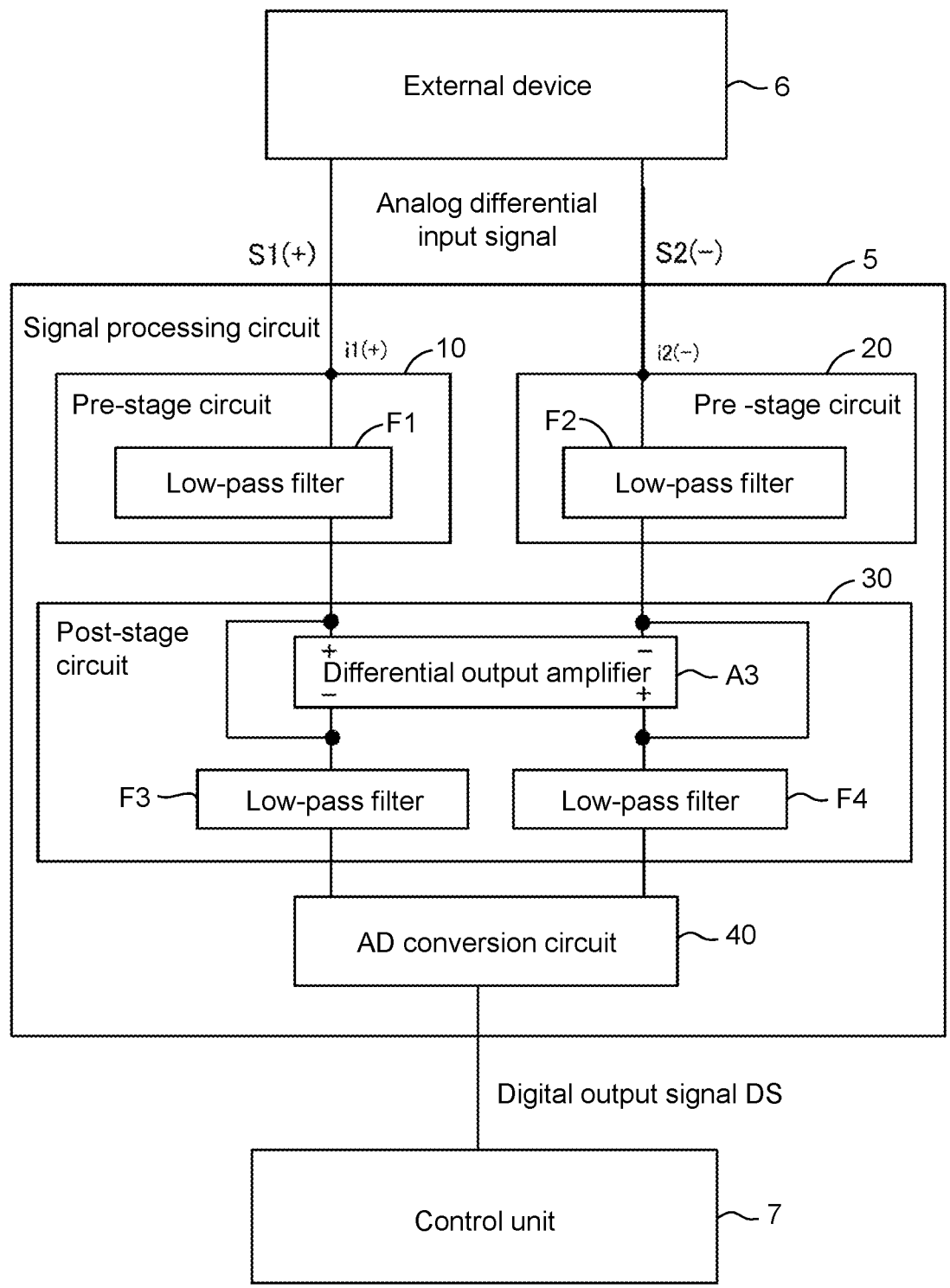
FIG. 1 is a block diagram illustrating a configuration of a signal processing circuit according to an embodiment.

With the aforementioned configuration, it is possible to remove high-frequency noise mixed into a signal that is input to the first input terminal since the first resistive element and the first capacitative element form a low-pass filter. Also, it is possible to remove common-mode noise of a differential input signal with the differential output amplifier. In this manner, it is possible to increase an input range and a resolution.

The post-stage circuit may include a second resistive element with one end connected to a negative output terminal of the differential output amplifier and a second capacitative element with one grounded electrode. The other end of the second resistive element, the other electrode of the second capacitative element, and one of two input terminals of the analog-to-digital conversion circuit may be connected to each other.

Circuit configurations of the first pre-stage circuit and the second pre-stage circuit may be the same.

The second pre-stage circuit may include a third resistive element with one end connected to the second input terminal and a third capacitative element with one grounded electrode. The other end of the third resistive element and the other electrode of the third capacitative element may be connected to each other.

The post-stage circuit may include a fourth resistive element with one end connected to a positive output terminal of the differential output amplifier and a fourth capacitative element with one grounded electrode. The other end of the fourth resistive element, the other electrode of the fourth capacitative element, and the other of the two input terminals of the analog-to-digital conversion circuit may be connected to each other.

The negative output terminal and a positive input terminal of the differential output amplifier may be connected via a fifth resistive element, and the positive output terminal and a negative input terminal of the differential output amplifier may be connected via a sixth resistive element.

Resistance values of the first resistive element and the third resistive element may be the same, resistance values of the second resistive element and the fourth resistive element may be the same, capacitance values of the first capacitative element and the third capacitative element may be the same, and capacitative values of the second capacitative element and the fourth capacitative element may be the same.

The output node of the first pre-stage circuit may be connected to the positive input terminal of the differential output amplifier via a seventh resistive element, and the output node of the second pre-stage circuit may be connected to the negative input terminal of the differential output amplifier via an eighth resistive element.

The first pre-stage circuit and the second pre-stage circuit may be connected to each other via a fifth capacitative element.

Analog signals from an external device may be supplied to the first input terminal and the second input terminal.

According to the embodiments, it is possible to increase an input range and a resolution.

§ 1. APPLICATION EXAMPLE

Figure 2A:
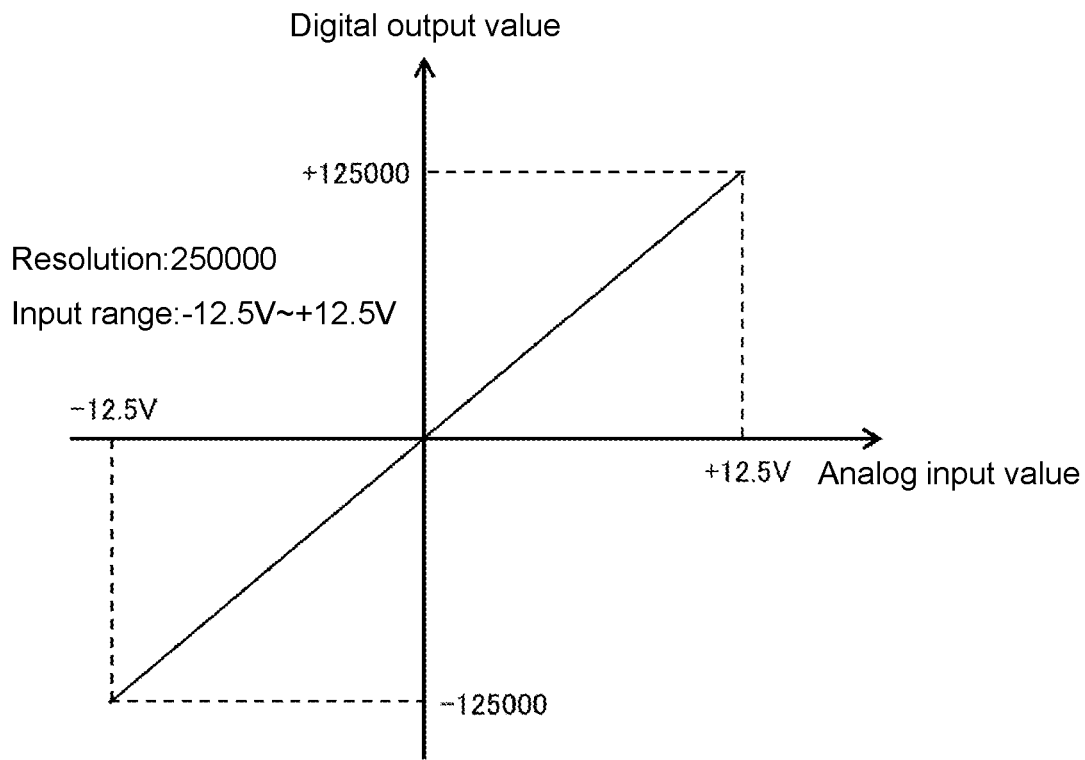
FIGS. 2a to 2c are graphs illustrating operations of the signal processing circuit according to the embodiment.
Figures 2B, 2C:
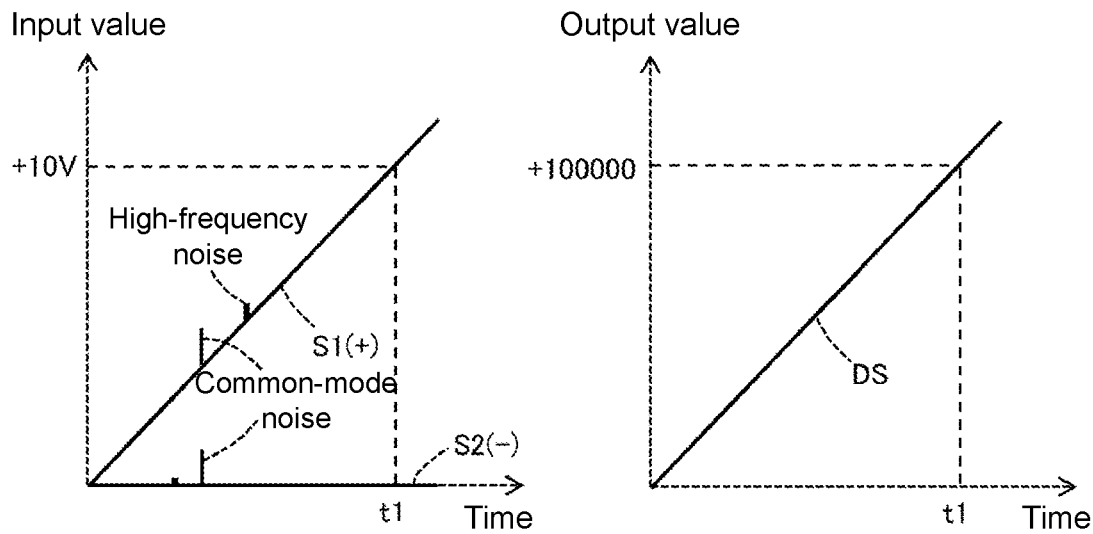

FIG. 1 is a block diagram illustrating a configuration of a signal processing circuit according to an embodiment. FIGS. 2a to 2c are graphs illustrating operations of the signal processing circuit according to the embodiment.

As illustrated in FIG. 1, a signal processing circuit 5 includes a pre-stage circuit 10 that receives a positive side (S1) of the analog differential input signals S1 and S2 from an external device 6 (a sensor, for example), a pre-stage circuit 20 that receives a negative side (S2) of the analog differential input signals S1 and S2, a post-stage circuit 30 that includes a differential output amplifier A3, and an AD conversion circuit 40 that is connected to the post-stage circuit 30.

The pre-stage circuit 10 includes a low-pass filter F1, and the pre-stage circuit 20 includes a low-pass filter F2. The input signal S1 is input to a positive input terminal of the differential output amplifier A3 via the low-pass filter F1, and the input signal S2 is input to a negative input terminal of the differential output amplifier A3 via the low-pass filter F2.

The differential output amplifier A3 is adapted to generate a negative output signal and a positive output signal using Vocm as a central voltage, and a difference between the positive output signal and the negative output signal is a value corresponding to a difference between a positive input signal and a negative input signal. The negative output signal of the differential output amplifier A3 is input to the AD conversion circuit 40 via a low-pass filter F3, and the positive output signal of the differential output amplifier A3 is input to the AD conversion circuit 40 via a low-pass filter F4. Note that the negative output signal of the differential output amplifier A3 is fed back to the positive input terminal of the differential output amplifier A3, and the positive output signal of the differential output amplifier A3 is fed back to the negative input terminal of the differential output amplifier A3.

The AD conversion circuit 40 performs AD conversion on a difference between the negative output signal and the positive output signal of the differential output amplifier A3, thereby generating a digital output signal DS. The digital output signal DS is input to a control unit 7 (a programmable logic controller (PLC), for example).

As illustrated in FIG. 2a, in a case in which resolution of the AD conversion circuit 40 is assumed to be 250,000 (corresponding to 18 bits) and a range of the differential input signals S1 and S2 (input values) is assumed to be −12.5 [V] to +12.5 [V], for example, a range of the digital output signal DS (output value) is from −125,000 to +125,000. A sampling period of the AD conversion circuit 40 is assumed to be 5 [μm] to 10 [μm], for example.

A signal processing circuit 5 converts the analog differential input signals S1 and S2 as illustrated in FIG. 2b into the digital output signal DS as illustrated in FIG. 2c. For example, S1=+10 [V], S2=0 [V], and DS=100,000 at a time t1.

As illustrated in FIGS. 2b and 2c, the low-pass filter F1 removes high-frequency noise mixed into the input signal S1, and the low-pass filter F2 removes high-frequency noise mixed into the input signal S2. The differential output amplifier A3 removes common-mode noise in the differential input signals S1 and S2.

It is possible to remove common-mode noise (caused by the AD conversion circuit 40 with high resolution, for example) in a route between the differential output amplifier A3 and the analog-to-digital conversion circuit 40 by using the differential output amplifier A3 (of differential outputs rather than single-end outputs).

The low-pass filter F3 removes high-frequency noise (caused by the AD conversion circuit 40 with high resolution, for example) mixed into the negative output signal of the differential output amplifier A3, and the low-pass filter F4 removes high-frequency noise (caused by the AD conversion circuit 40 with high resolution, for example) mixed into the positive output signal of the differential output amplifier A3.

Since the negative output signal of the differential output amplifier A3 is fed back to the positive input terminal of the differential output amplifier A3, it is possible to remove noise (caused by the AD conversion circuit 40 with high resolution, for example) in a route between the negative output terminal of the differential output amplifier A3 and the analog-to-digital conversion circuit 40. Since the positive output signal of the differential output amplifier A3 is fed back to the negative input terminal of the differential output amplifier A3, it is possible to remove noise (caused by the AD conversion circuit 40 with high resolution, for example) in a route between the positive output terminal of the differential output amplifier A3 and the analog-to-digital conversion circuit 40.

As described above, it is possible to increase an input range and a resolution since the signal processing circuit 5 has an excellent noise removing function (noise resistance).

2. CONFIGURATION EXAMPLE

Figure 3:
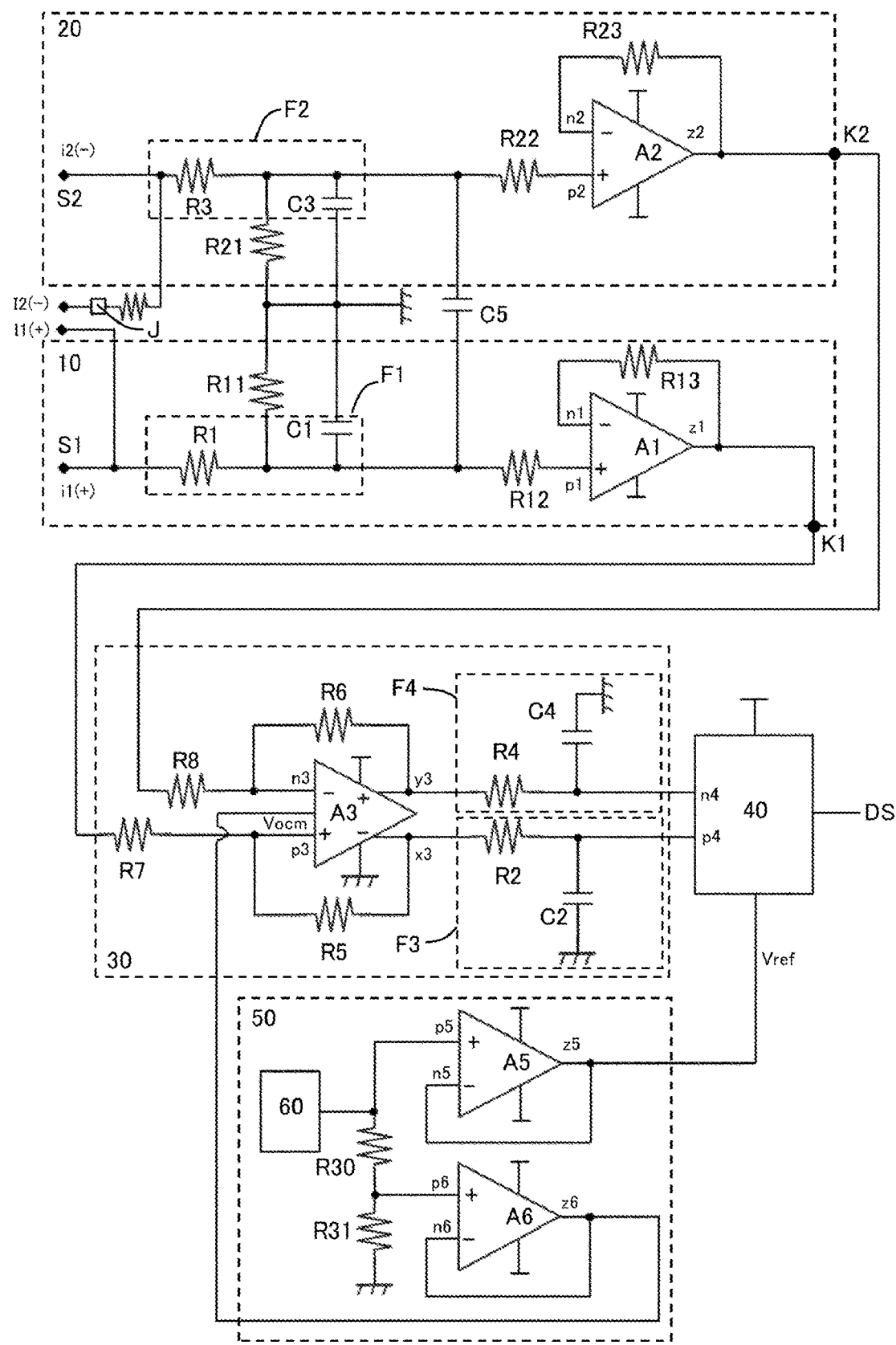
FIG. 3 is a circuit diagram illustrating a configuration of a signal processing circuit according to a first embodiment.

FIG. 3 is a circuit diagram illustrating a configuration of a signal processing circuit according to a first embodiment. As illustrated in FIG. 3, the signal processing circuit 5 (an analog input unit, for example) includes the pre-stage circuits 10 and 20, the post-stage circuit 30, the AD conversion circuit 40, and a reference voltage generation circuit 50.

The pre-stage circuit 10 includes an input terminal i1 (first input terminal) on the positive side, resistive elements R1, R11, R12, and R13, a capacitative element C1, and an operational amplifier A1. One end of the resistive element R1 is connected to the input terminal i1, one electrode of the capacitative element C1 is grounded, and the other end of the resistive element R1 and the other electrode of the capacitative element C1 are connected to each other. The resistive element R1 (first resistive element) and the capacitative element C1 (first capacitative element) form the low-pass filter F1. The other end of the resistive element R1 is grounded via the resistive element R11 and is also connected to a positive input terminal p1 of the operational amplifier A1 via the resistive element R12. A negative input terminal n1 of the operational amplifier A1 is connected to an output terminal z1 of the operational amplifier A1 via the resistive element R13. The resistive elements R12 and R13 and the operational amplifier A1 function as a buffer circuit, for example. The output terminal z1 of the operational amplifier A1 is coupled to an output node K1 of the pre-stage circuit 10. The input terminal it is for inputting a voltage signal, and an input terminal I1 (on the positive side) is for inputting a current signal.

The pre-stage circuit 20 includes an input terminal i2 (second input terminal) on the negative side, resistive elements R3, R21, R22 and R23, a capacitative element C3, and an operational amplifier A2. One end of the resistive element R3 is connected to the input terminal i2, one electrode of the capacitative element C3 is grounded, and the other end of the resistive element R3 and the other electrode of the capacitative element C3 are connected to each other. The resistive element R3 (third resistive element) and the capacitative element C3 (third capacitative element) form the low-pass filter F2. The other end of the resistive element R3 is grounded via the resistive element R21 and is also connected to a positive input terminal p2 of the operational amplifier A2 via the resistive element R22. A negative input terminal n2 of the operational amplifier A2 is connected to an output terminal z2 of the operational amplifier A2 via the resistive element R23. The resistive elements R22 and R23, and the operational amplifier A2 function as a buffer circuit, for example. The output terminal z2 of the operational amplifier A2 is coupled to an output node K2 of the pre-stage circuit 20. The input terminal i2 is for inputting a voltage signal, and an input terminal I2 (on the negative side) is for inputting a current signal. The input terminal I2 is connected to the input terminal i2 via a fuse J and a resistive element.

The other end of the resistive element R3 of the pre-stage circuit 20 is connected to the other end of the resistive element R1 of the pre-stage circuit 10 via a capacitative element C5 (fifth capacitative element). In this manner, it is possible to secure a balance of signal processing between the pre-stage circuit 10 and the pre-stage circuit 20.

The post-stage circuit 30 includes resistive elements R2, R4, R5, R6, R7, and R8, capacitative elements C2 and C4, and the differential output amplifier A3. The output node K1 of the pre-stage circuit 10 is connected to a positive input terminal p3 of the differential output amplifier A3 via the resistive element R7 (seventh resistive element), and the output node K2 of the pre-stage circuit 20 is connected to a negative input terminal n3 of the differential output amplifier A3 via the resistive element R8 (eighth resistive element). The differential output amplifier A3 is adapted to generate a negative output signal and a positive output signal using Vocm as a central voltage, and a difference between the positive output signal and the negative output signal is a value corresponding to a difference between a positive input signal and a negative input signal.

One end of the resistive element R2 is connected to a negative output terminal x3 of the differential output amplifier A3, one electrode of the capacitative element C2 is grounded, and the other end of the resistive element R2, the other electrode of the capacitative element C2, and a positive input terminal p4 of the AD conversion circuit 40 are connected to each other. The resistive element R2 (second resistive element) and the capacitative element C2 (second capacitative element) form the low-pass filter F3.

One end of the resistive element R4 is connected to a positive output terminal y3 of the differential output amplifier A3, one electrode of the capacitative element C4 is grounded, and the other end of the resistive element R4, the other electrode of the capacitative element C4, and a negative input terminal n4 of the AD conversion circuit 40 are connected to each other. The resistive element R4 (fourth resistive element) and the capacitative element C4 (fourth capacitative element) form the low-pass filter F4.

The negative output terminal x3 of the differential output amplifier A3 is feedback-connected to the positive input terminal p3 of the differential output amplifier A3 via the resistive element R5, and the positive output terminal y3 of the differential output amplifier A3 is feedback-connected to the negative input terminal n3 of the differential output amplifier A3 via the resistive element R6.

The reference voltage generation circuit 50 includes a reference IC (integrated circuit) 60, resistive elements R30 and R31 and operational amplifiers A5 and A6 and generates the central voltage Vocm for the differential output amplifier A3 and a reference voltage Vref for the AD conversion circuit 40.

An output of the reference IC 60 is connected to a positive input terminal p5 of the operational amplifier A5, and the reference voltage Vref that is an output of the operational amplifier A5 is input to the AD conversion circuit 40. An output terminal z5 of the operational amplifier A5 is connected to a negative input terminal n5 thereof.

An output of the reference IC 60 is connected to a positive input terminal p6 of the operational amplifier A6 via the resistive element R30, the positive input terminal p6 is grounded via the resistive element R31, and Vocm that is an output of the operational amplifier A6 is input as a central voltage to the differential output amplifier A3. An output terminal z6 of the operational amplifier A6 is connected to a negative input terminal n6 thereof.

If it is assumed that Vocm=1.25 [V] and Vref=2.5 [V], the positive input signal of the differential output amplifier A3=1.0 [V], the negative input signal of the differential output amplifier A3=0 [V], and the positive output signal of the differential output amplifier A3=2.25 [V], and the negative output signal of the differential output amplifier A3=0.25 [V] at t1 (S1=+10 [V] and S2=0 [V]) in FIGS. 2b and 2c, for example. Since the AD conversion circuit 40 causes Vref=2.5 [V] to correspond to +125,000, a digital output value becomes 100,000 at t1 at which the difference between the positive output signal and the negative output signal of the differential output amplifier A3 is 2.0 [V].

In Example 1, the pre-stage circuit 10 and the pre-stage circuit 20 may have the same circuit configurations, and the resistance value of the resistive element R1=the resistance value of the resistive element R3, the capacitance value of the capacitative element C1=the capacitance value of the capacitative element C3, the resistance value of the resistive element R11=the resistance value of the resistive element R21, the resistance value of the resistive element R12=the resistance value of the resistive element R22, and the resistance value of the resistive element R13=the resistance value of the resistive element R23 may be satisfied. Also, in the post-stage circuit 30, the resistance value of the resistive element R2=the resistance value of the resistive element R4, the capacitance value of the capacitative element C2=the capacitance value of the capacitative element C4, the resistance value of the resistive element R5=the resistance value of the resistive element R6, and the resistance value of the resistive element R7=the resistance value of the resistive element R8 may be satisfied. In this manner, operations can be performed even if the output of the external device on the negative side is connected to the input terminal i1 (+) and the output of the external device on the positive side is connected to the input terminal i2 (−).

Second Embodiment

Figure 4:
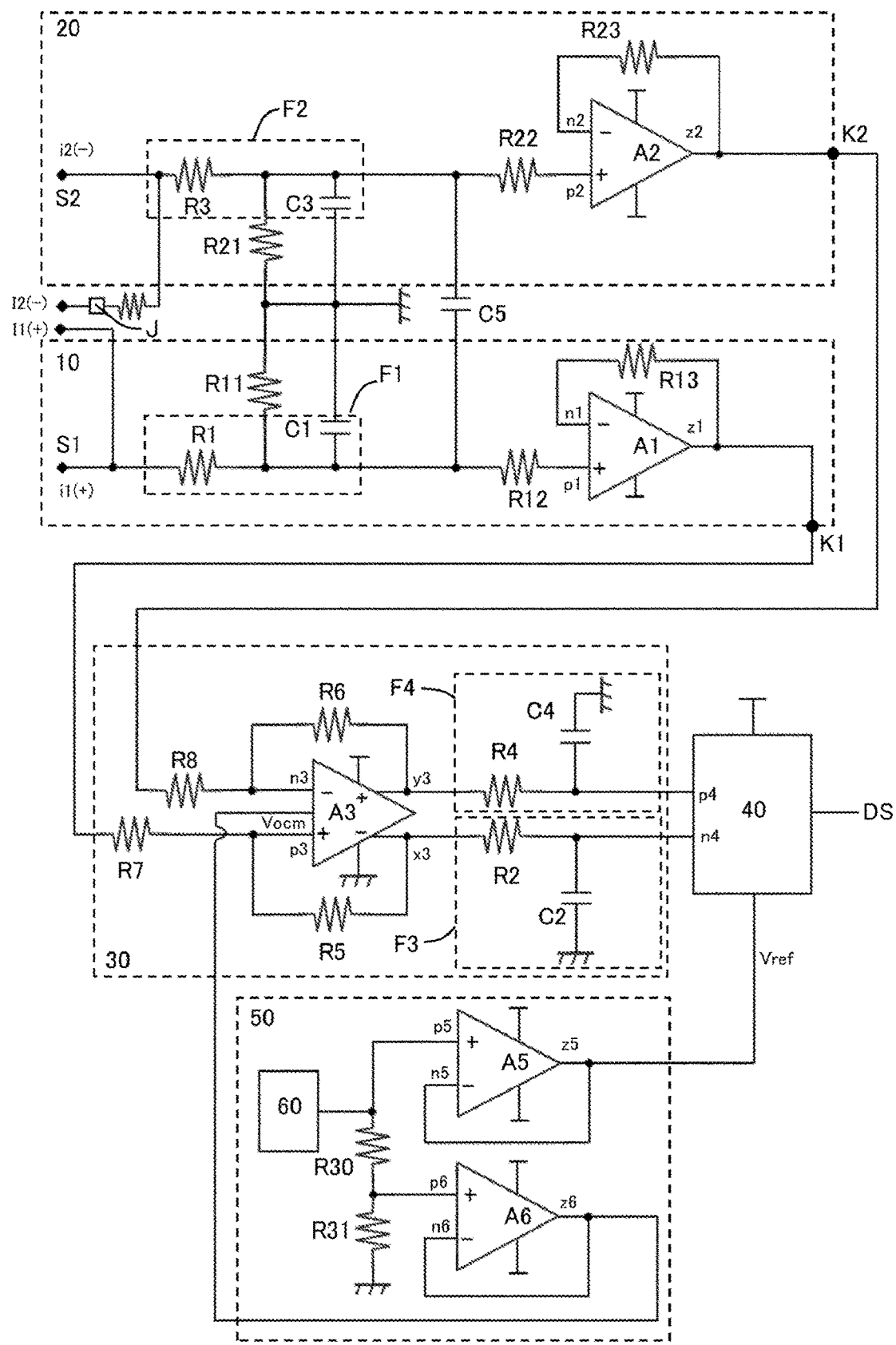
FIG. 4 is a circuit diagram illustrating a configuration of a signal processing circuit according to a second embodiment.

Although the negative output terminal x3 of the differential output amplifier A3 is connected to the positive input terminal p4 of the AD conversion circuit 40 via the low-pass filter F3 and the positive output terminal y3 of the differential output amplifier A3 is connected to the negative input terminal n4 of the AD conversion circuit 40 via the low-pass filter F4 in the first embodiment illustrated in FIG. 3, the disclosure is not limited thereto. As illustrated in FIG. 4, a configuration in which the negative output terminal x3 of the differential output amplifier A3 is connected to the negative input terminal n4 of the AD conversion circuit 40 via the low-pass filter F3, and the positive output terminal y3 of the differential output amplifier A3 is connected to the positive input terminal p4 of the AD conversion circuit 40 via the low-pass filter F4 in order to reduce noise in the route between the differential output amplifier A3 and the analog-to-digital conversion circuit 40 may also be employed.

The disclosure is not limited to the aforementioned embodiments, and for example, a configuration obtained by removing the low-pass filters F2, F3, and F4 in FIG. 1 can also be employed, and a configuration obtained by removing the operational amplifiers A1 and A2 in FIG. 3 can also be employed. Configurations obtained by appropriately combining technical mechanisms disclosed in different examples are also included in the embodiments.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A signal processing circuit comprising:
a first pre-stage circuit that includes a first input terminal for receiving one of differential input;
a second pre-stage circuit that includes a second input terminal for receiving another one of the differential input;
a post-stage circuit that includes a differential output amplifier; and
an analog-to-digital conversion circuit connected to the post-stage circuit,
wherein the first pre-stage circuit includes a first resistive element with one end connected to the first input terminal and a first capacitative element with one grounded electrode,
an other end of the first resistive element and an other electrode of the first capacitative element are connected to each other, and
an output node of the first pre-stage circuit and an output node of the second pre-stage circuit are connected to the post-stage circuit.

2. The signal processing circuit according to claim 1, wherein
the post-stage circuit includes a second resistive element with one end connected to a negative output terminal of the differential output amplifier and a second capacitative element with one grounded electrode, and
an other end of the second resistive element, an other electrode of the second capacitative element, and one of two input terminals of the analog-to-digital conversion circuit are connected to each other.

3. The signal processing circuit according to claim 1, wherein circuit configurations of the first pre-stage circuit and the second pre-stage circuit are the same.

4. The signal processing circuit according to claim 2, wherein circuit configurations of the first pre-stage circuit and the second pre-stage circuit are the same.

5. The signal processing circuit according to claim 2, wherein
the second pre-stage circuit includes a third resistive element with one end connected to the second input terminal and a third capacitative element with one grounded electrode, and
an other end of the third resistive element and an other electrode of the third capacitative element are connected to each other.

6. The signal processing circuit according to claim 5, wherein
the post-stage circuit includes a fourth resistive element with one end connected to a positive output terminal of the differential output amplifier and a fourth capacitative element with one grounded electrode, and
an other end of the fourth resistive element, an other electrode of the fourth capacitative element, and the other of the two input terminals of the analog-to-digital conversion circuit are connected to each other.

7. The signal processing circuit according to claim 6, wherein the negative output terminal and a positive input terminal of the differential output amplifier are connected via a fifth resistive element, and the positive output terminal and a negative input terminal of the differential output amplifier are connected via a sixth resistive element.

8. The signal processing circuit according to claim 7, wherein resistance values of the first resistive element and the third resistive element are the same, resistance values of the second resistive element and the fourth resistive element are the same, capacitance values of the first capacitative element and the third capacitative element are the same, and capacitance values of the second capacitative element and the fourth capacitative element are the same.

9. The signal processing circuit according to claim 7, wherein the output node of the first pre-stage circuit is connected to the positive input terminal of the differential output amplifier via a seventh resistive element, and the output node of the second pre-stage circuit is connected to the negative input terminal of the differential output amplifier via an eighth resistive element.

10. The signal processing circuit according to claim 7, wherein the first pre-stage circuit and the second pre-stage circuit are connected to each other via a fifth capacitative element.

11. The signal processing circuit according to claim 1, wherein analog signals from an external device are supplied to the first input terminal and the second input terminal.

12. The signal processing circuit according to claim 2, wherein analog signals from an external device are supplied to the first input terminal and the second input terminal.

13. The signal processing circuit according to claim 3, wherein analog signals from an external device are supplied to the first input terminal and the second input terminal.

14. The signal processing circuit according to claim 5, wherein analog signals from an external device are supplied to the first input terminal and the second input terminal.

15. The signal processing circuit according to claim 6, wherein analog signals from an external device are supplied to the first input terminal and the second input terminal.

16. The signal processing circuit according to claim 7, wherein analog signals from an external device are supplied to the first input terminal and the second input terminal.

17. The signal processing circuit according to claim 8, wherein analog signals from an external device are supplied to the first input terminal and the second input terminal.

18. The signal processing circuit according to claim 9, wherein analog signals from an external device are supplied to the first input terminal and the second input terminal.

19. The signal processing circuit according to claim 10, wherein analog signals from an external device are supplied to the first input terminal and the second input terminal.

* * * * *